(12) United States Patent
Lee et al.

(10) Patent No.: US 12,506,104 B2
(45) Date of Patent: Dec. 23, 2025

(54) SENSOR PACKAGE

(71) Applicant: PIXART IMAGING INC., Hsin-Chu (TW)

(72) Inventors: Sai-Mun Lee, Penang (MY); Chee-Pin T'Ng, Penang (MY)

(73) Assignee: PIXART IMAGING INC., Hsin-Chu (TW)

( * ) Notice: Subject to any disclaimer, the term of this patent is extended or adjusted under 35 U.S.C. 154(b) by 429 days.

(21) Appl. No.: 18/149,121

(22) Filed: Jan. 2, 2023

(65) Prior Publication Data

US 2024/0222308 A1    Jul. 4, 2024

(51) Int. Cl.
*H01L 23/00* (2006.01)

(52) U.S. Cl.
CPC .............. *H01L 24/29* (2013.01); *H01L 24/30* (2013.01); *H01L 24/32* (2013.01); *H01L 24/83* (2013.01); *H01L 24/06* (2013.01); *H01L 24/48* (2013.01); *H01L 24/49* (2013.01); *H01L 24/73* (2013.01); *H01L 2224/0603* (2013.01); *H01L 2224/06155* (2013.01); *H01L 2224/06181* (2013.01); *H01L 2224/29007* (2013.01); *H01L 2224/29013* (2013.01); *H01L 2224/29015* (2013.01); *H01L 2224/29021* (2013.01); *H01L 2224/29023* (2013.01); *H01L 2224/2919* (2013.01); *H01L 2224/2929* (2013.01); *H01L 2224/29339* (2013.01); *H01L 2224/3015* (2013.01); *H01L 2224/30505* (2013.01); *H01L 2224/30517* (2013.01); *H01L 2224/32227* (2013.01); *H01L 2224/48227* (2013.01); *H01L 2224/4912* (2013.01); *H01L 2224/73265* (2013.01); *H01L 2224/83192* (2013.01); *H01L 2924/0665* (2013.01)

(58) Field of Classification Search
CPC .......... H01L 24/29; H01L 24/30; H01L 24/32
See application file for complete search history.

(56) References Cited

U.S. PATENT DOCUMENTS

2022/0093482 A1\* 3/2022 Punzalan ............ H01L 23/3185

\* cited by examiner

*Primary Examiner* — Walter H Swanson
(74) *Attorney, Agent, or Firm* — Li & Cai Intellectual Property (USA) Office

(57) ABSTRACT

A sensor packaging method and a sensor package are provided. The method includes: providing a substrate having upper and lower board surfaces, in which the upper board surface has a die-bonding region. The substrate includes a core material layer, an upper metal layer, and an upper protection layer, a first window is formed to penetrate the upper protection layer and located at a periphery of the die-bonding region, and the first window is opened for a first ground electrode connected to a first ground portion. The method further includes: performing a dispensing step to apply an adhesive material on the upper board surface in at least a portion of the die-bonding region; and attaching a sensor die to the substrate through the adhesive material, in which the sensor die is disposed in the die-bonding region and has a first ground pin electrically connected to the first ground electrode.

18 Claims, 10 Drawing Sheets

SENSOR PACKAGE

FIELD OF THE DISCLOSURE

The present disclosure relates to a packaging method and a package, and more particularly to a sensor packaging method and a sensor package.

BACKGROUND OF THE DISCLOSURE

In the existing substrate-based electronic package, a sensor chip or a sensor die can attached on a fully-metalized-and-plated surface of a substrate by using a die-attached epoxy. However, adhesion strength between the metalized-and-plated surface and die attached epoxy may be affected by metal surface characteristics on the adhesion.

Furthermore, for the existing optical sensor package, the sensor is directly attached to the metalized-and-plated surface, which is different from a configuration of an optical module connected with a sensor cover that is attached to the solder mask of the substrate. Therefore, a thickness of the solder mask needs to be considered in designing the optical module, the sensor cover and the sensor, and during a process for fabricating the electronic package, such thickness may cause additional costs in design and increase difficulty of manufacturing.

SUMMARY OF THE DISCLOSURE

In response to the above-referenced technical inadequacies, the present disclosure provides a sensor packaging method and a sensor package capable of enhancing an adhesion strength between a substrate and a sensor die.

In one aspect, the present disclosure provides a sensor packaging method, including: providing a substrate having an upper board surface and a lower board surface, in which the upper board surface has a die-bonding region, and the substrate includes a core material layer, an upper metal layer disposed on the core material layer, and an upper protection layer disposed on the upper metal layer, in which a first window is formed to penetrate the upper protection layer and located at a periphery of the die-bonding region, and the first window is opened for a first ground electrode that is electrically connected to a first ground portion of the upper metal layer. The sensor packaging method further includes: performing a dispensing step to apply an adhesive material on the upper board surface in at least a portion of the die-bonding region; and attaching a sensor die to the substrate through the adhesive material, in which the sensor die is disposed in the die-bonding region and has a first ground pin electrically connected to the first ground electrode.

In another aspect, the present disclosure provides a sensor package, which includes a substrate and a sensor die. The substrate has an upper board surface and a lower board surface, and the upper board surface has a die-bonding region. The substrate includes a core material layer, an upper metal layer disposed on the core material layer, and an upper protection layer disposed on the upper metal layer. The upper protection layer has a first metalized window located at a periphery of the die-bonding region, and the first metalized window is electrically connected to a first ground portion of the upper metal layer. The sensor die is disposed on the substrate in the die-bonding region, the substrate is attached to the substrate through the adhesive material applied in the die-bonding region, and the sensor die has a first ground pin electrically connected to the first metalized window.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
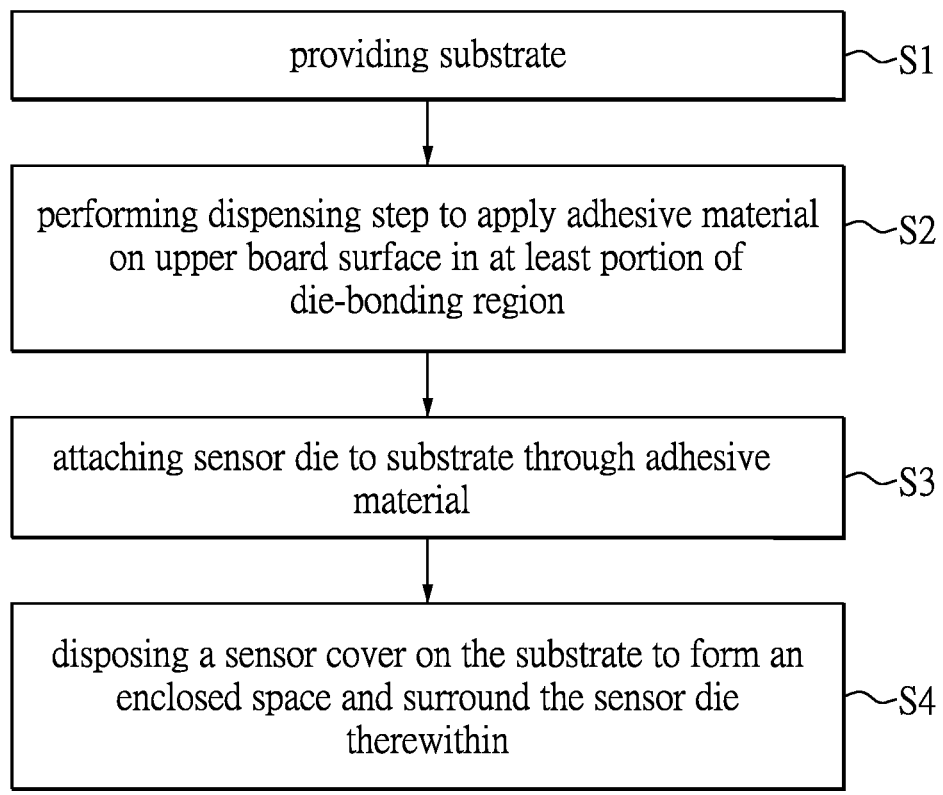
FIG. 1 is a flowchart of a sensor packaging method according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

FIG. 1 is a flowchart of a sensor packaging method according to one embodiment of the present disclosure. Reference can be made to FIG. 1, one embodiment of the present disclosure provides a sensor packaging method, which includes the following steps:

Step S1: providing a substrate.

Figure 2:
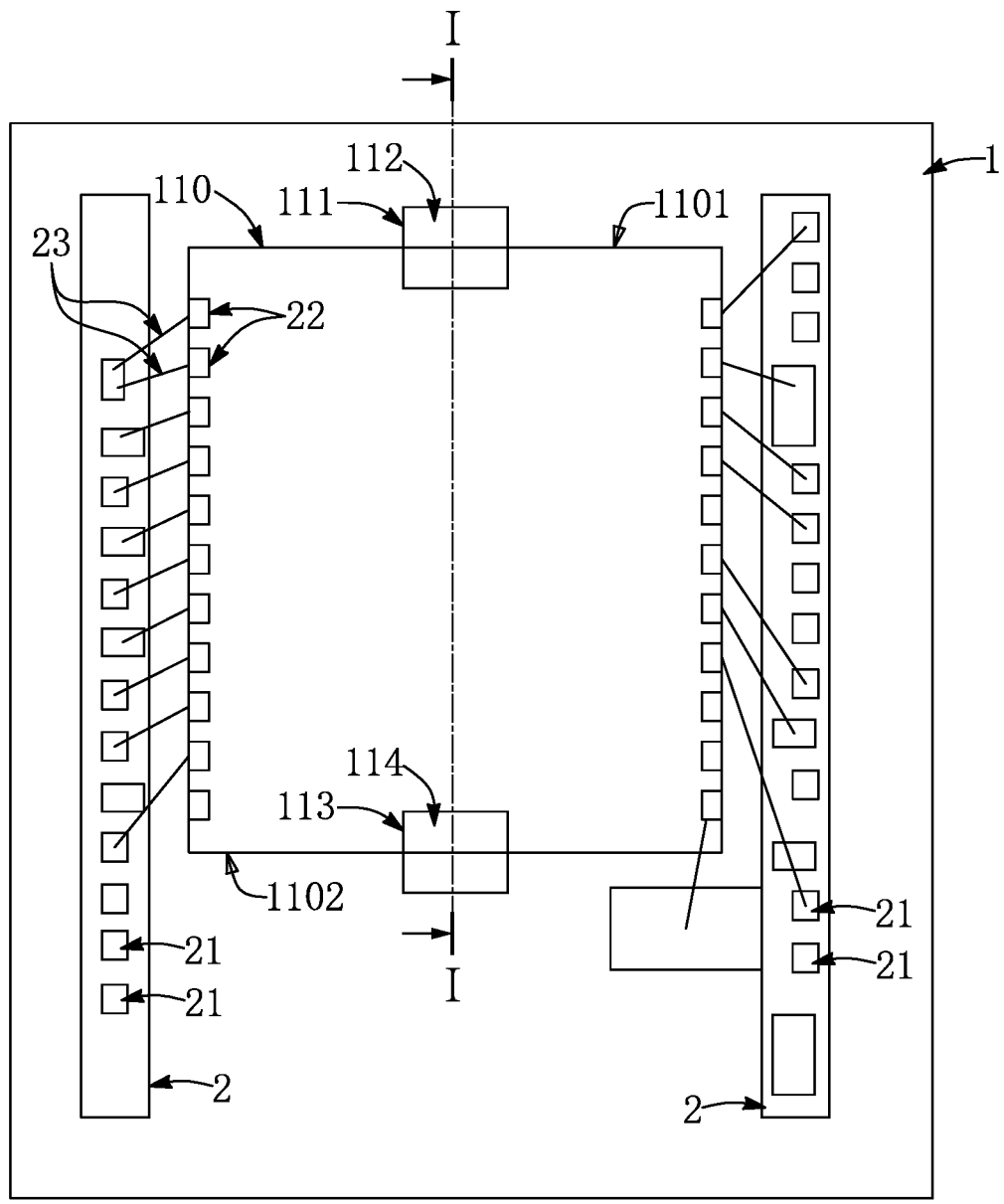
FIG. 2 is schematic top view of the substrate according to a first embodiment of the present disclosure.
Figure 3:
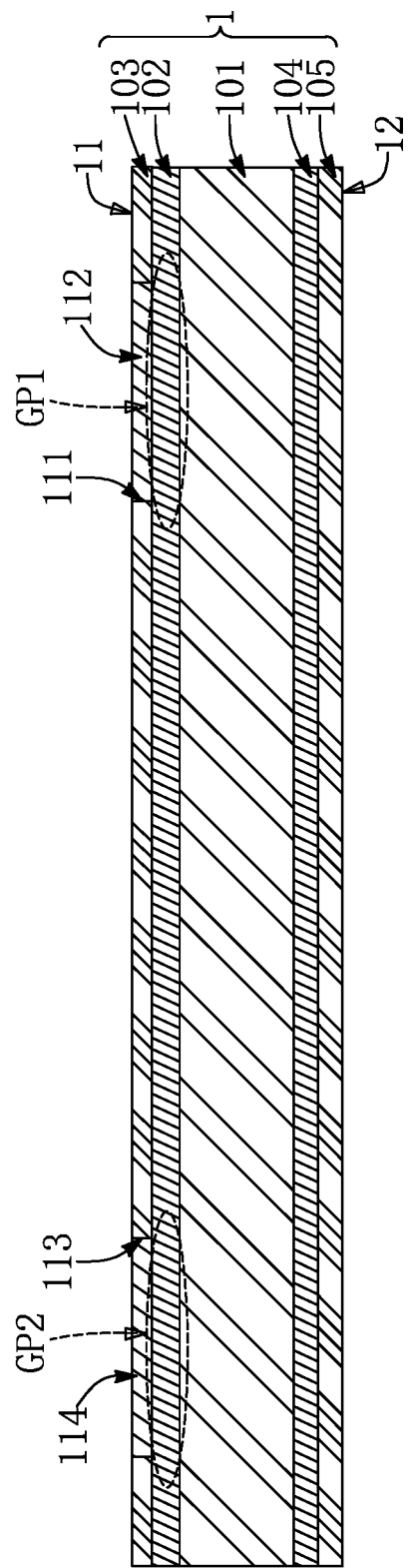
FIG. 3 is a schematic cross-sectional view taken along line I-I of FIG. 2.

Reference can be made to FIGS. 2 and 3, FIG. 2 is schematic top view of the substrate according to a first embodiment of the present disclosure, and FIG. 3 is a schematic cross-sectional view taken along line I-I of FIG. 2.

As shown in FIGS. 2 and 3, the substrate 1 can be, for example, a printed circuit board (PCB), which has an upper board surface 11 and a lower board surface 12. The upper board surface 11 has a die-bonding region 110, and the substrate 1 includes a core material layer 101, an upper metal layer 102 disposed on the core material layer 101, and an upper protection layer 103 disposed on the upper metal layer 102. The substrate 1 also includes a lower metal layer 104 and a lower protection layer 105 that are disposed below the core material layer 101, but the present disclosure does not limit specific implementation of the substrate 1.

In certain embodiments that the PCB is used as the substrate, the upper protection layer 103 and the lower protection layer 105 can be, for example, solder masks, which are thin lacquer-like layers of polymer that is usually applied to copper traces of the PCB for protection against oxidation and to prevent solder bridges from forming between closely spaced solder pads arranged on the PCB. Furthermore, the core material layer 101 can include one or more layers, and such layers can be made of materials such as Flame Retardant 4 (FR4), Flame Retardant 5 (FR5), Bismaleimide-Triazine (BT), a resin and/or a thermosetting resin. In certain embodiments, the substrate 1 can also be coreless substrate. However, the aforementioned details are disclosed for exemplary purposes only, and are not meant to limit the scope of the present disclosure.

As shown in FIGS. 2 and 3, a first window 111 is formed to penetrate the upper protection layer 102 and located at a periphery of the die-bonding region 110, and the first window 111 is opened for a first ground electrode 112 that is used to be electrically connected to a first ground portion GP1 of the upper metal layer 102. It should be noted that the substrate 1 provided by the present disclosure can be a sensor substrate used to fabricate a sensor package, thus a plurality of metal wires can be pre-formed in the upper metal layer 102 with specific patterns, so as to provide necessary circuits for a sensor die or a sensor chip to be arranged on the die-bonding region 110 in the subsequent steps. The circuits can include, for example, power circuits for supplying electronic powers and ground circuits (e.g., corresponding to the first ground portion GP1) that enable electronic ground connections, or other necessary circuits that can support proper operation of the sensor die or the sensor chip to be arranged.

For forming the first ground electrode 112, a drilling process can be performed on the upper protection layer 103 first to form an opening to expose the upper metal layer 102 to form the first window 111, and then a metallization process, such as a deposition process, a soldering process, an electroplating process or an electroless plating process, can be performed to coat a metal layer in the opening and on the upper metal layer, so as to form the first ground electrode. Since the processes for forming metal layer are known to those skilled in the art, details thereof will be omitted hereinafter.

It should be noted that the number of ground electrodes is not limited in the present disclosure. For example, as further shown in FIG. 2, in addition to the first window 111 and the first ground electrode 112, a second window 113 can be further formed to penetrate the upper protection layer 103 and located at the periphery of the die-bonding region 110 without overlapping with the first window 111. In this case, the second window 113 is opened for a second ground electrode 114 that is electrically connected to a second ground portion GP2 of the upper metal layer 102.

Similarly, another set of ground circuits (e.g., corresponding to the second ground portion GP1) that enable other set of electronic ground connections can be included in the circuits formed in the upper metal layer 102. Moreover, in the present embodiment, the die-boding region 12 can be in any shape, such as a simple geometric shape like a rectangle, but the present disclosure is not limited thereto, the die-bonding region 110 can be provided with any suitable shape that corresponding to the die or chip to be arranged. In the case that the die-boding region 12 is rectangular, the first window 111 and the second window 113 are respectively located at a first side 1101 and a second side 1102 of that are opposite to each other.

In certain embodiments, lead frames 2 can be disposed on the upper board surface 11 to surround the die-bonding region 110, and can include multiple pads 21 that are pre-bonded with electronic connections 22 arranged at the periphery (such as sides without overlapping with the first window 111 and the second window 113) of the die-bonding region 110 through multiple metal wires 23, respectively, but the present disclosure is not limited thereto.

Step S2: performing a dispensing step to apply an adhesive material on the upper board surface in at least a portion of the die-bonding region.

Figure 4:
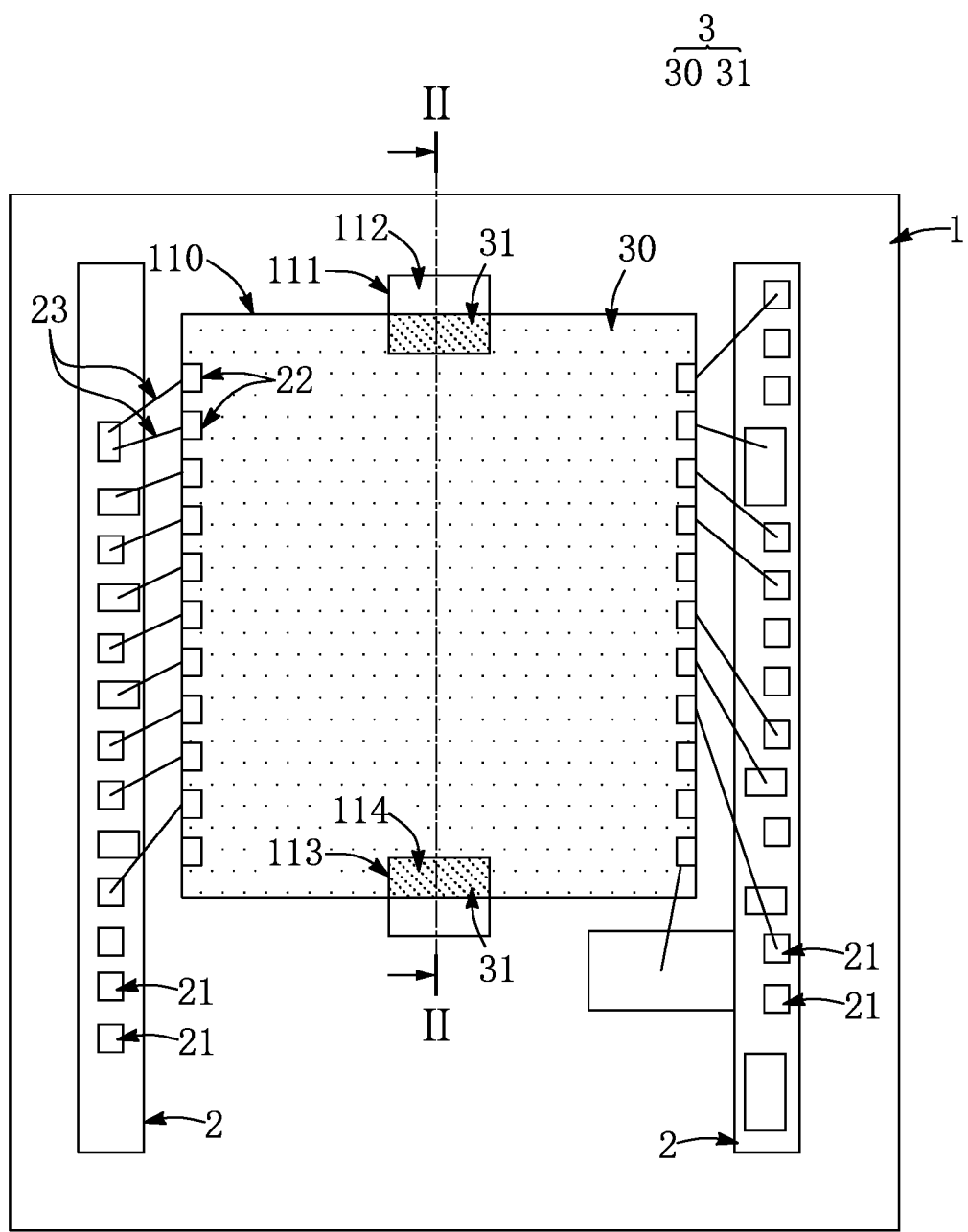
FIG. 4 is schematic top view of step S2 of the sensor packaging method according to the first embodiment of the present disclosure.
Figure 5:
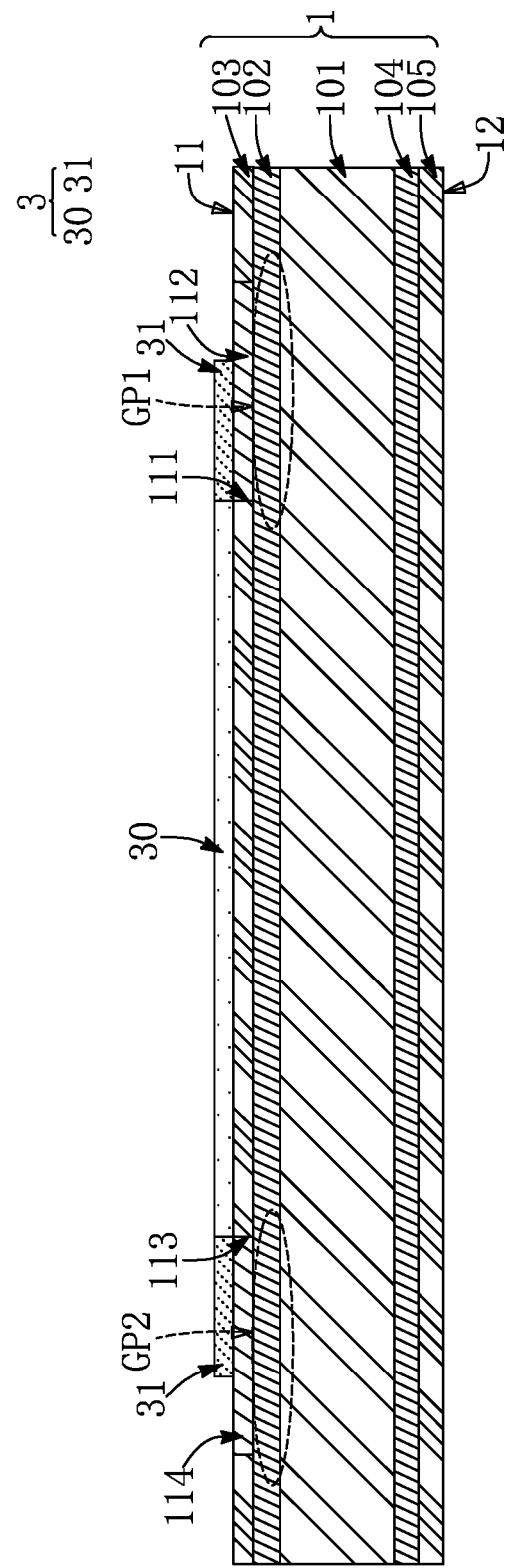
FIG. 5 is a schematic cross-sectional view taken along line II-II of FIG. 4.

Reference can be made to FIGS. 4 and 5, FIG. 4 is schematic top view of step S2 of the sensor packaging method according to the first embodiment of the present disclosure, and FIG. 5 is a schematic cross-sectional view taken along line II-II of FIG. 4.

As shown in FIGS. 4 and 5, an adhesive material 3 can be applied on the upper board surface 11 in at least a portion of the die-bonding region 110. In some embodiments, the adhesive material 3 can be applied on the upper board surface 11 to fully cover the die-bonding region 110. The adhesive material 3 can be, for example, various types of die attach epoxies. In the present embodiment, the adhesive material 3 can be applied by an adhesive dispenser, and can include a non-conductive adhesive material 30 and an electrically conductive adhesive material 31. The electrically conductive adhesive material 31 normally achieves good electrical conductivity by inclusion of metallic fillers, such as silver, in the adhesive, and the electrically conductive adhesive material 31 can be applied on at least a portion of the first ground electrode 112 and at least a portion of the second ground electrode 113, while the non-conductive adhesive material 30 can be applied in the rest region in the die-bonding region 110, that is, a portion of the die-bonding region 110 that does not overlap with the first window 111 and the second window 113. However, in some embodiments, the electrically conductive adhesive material 31 can be applied to fully cover the first ground electrode 112 and the second ground electrode 113.

In other embodiments, only the non-conductive adhesive material 30 is applied on the portion of the die-bonding region 110 that does not overlap with the first window 111 and the second window 113, which is suitable for a certain type of the sensor die or chip that has ground pins protruding from a lower surface thereof, so as to direct contact and electrically connected to the first ground electrode 112 and the second ground electrode 114 without using the electrically conductive adhesive material 31.

Step S3: attaching a sensor die to the substrate through the adhesive material.

Figure 6:
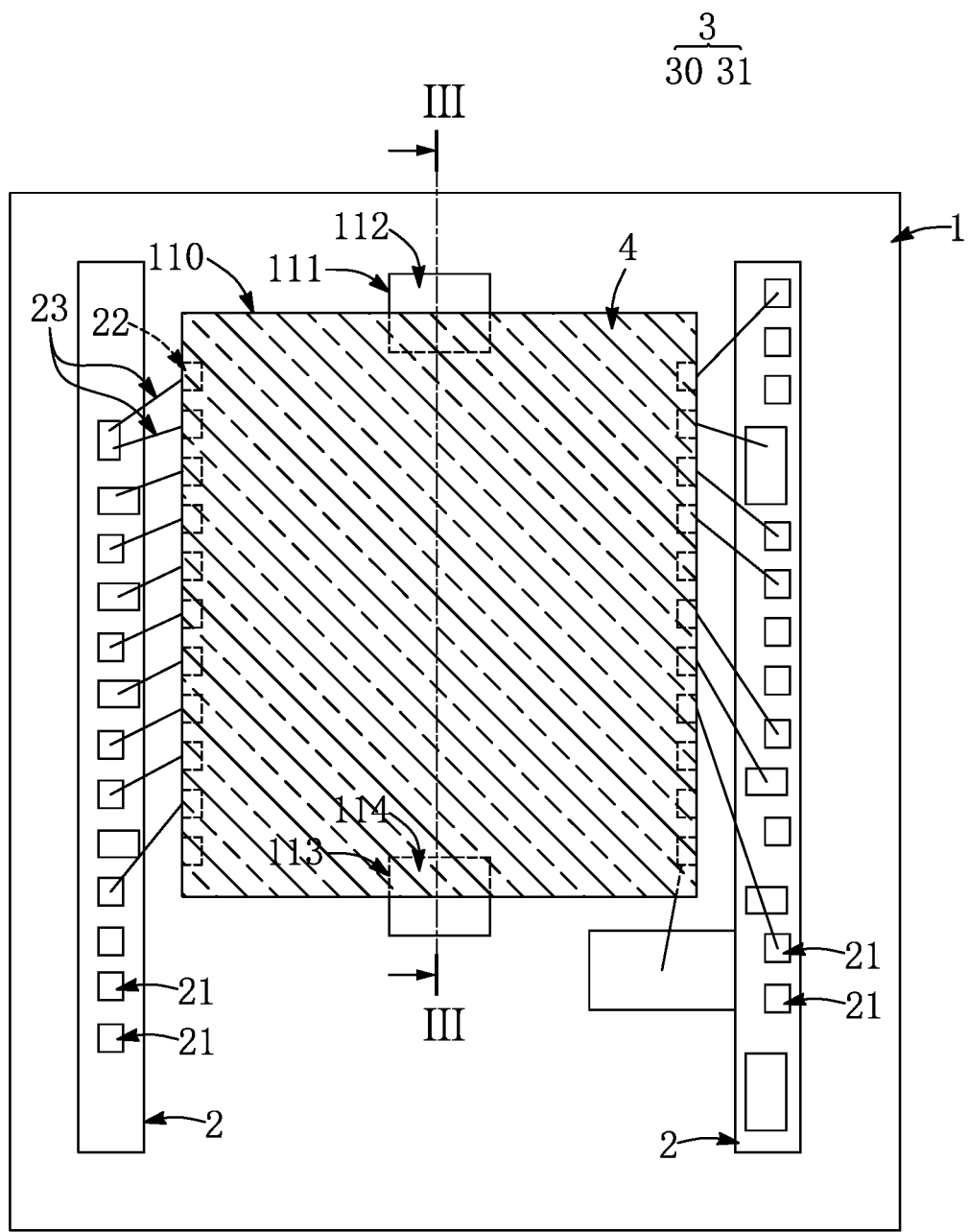
FIG. 6 is a schematic top view of step S3 of the sensor packaging method according to the first embodiment of the present disclosure.
Figure 7:
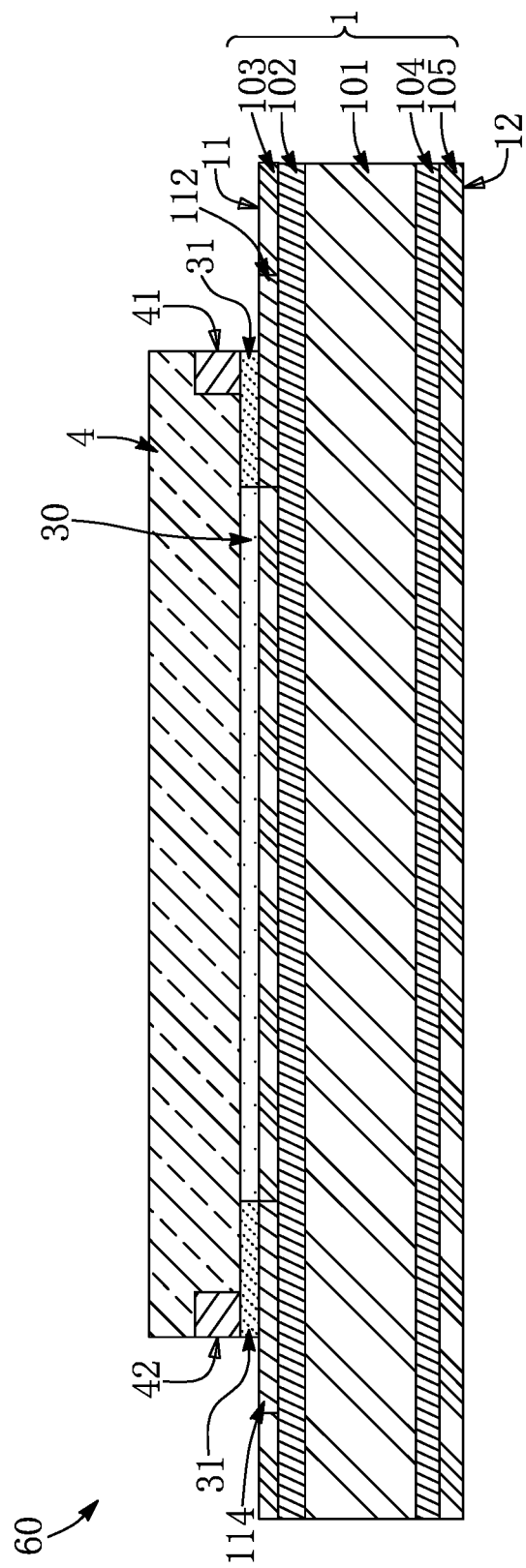
FIG. 7 is a schematic cross-sectional view taken along line III-III of FIG. 6.

Reference can be made to FIGS. 6 and 7, FIG. 6 is schematic top view of step S3 of the sensor packaging method according to the first embodiment of the present disclosure, and FIG. 7 is a schematic cross-sectional view taken along line III-III of FIG. 6.

As shown in FIGS. 6 and 7, a sensor die 4 having a first ground pin 41 and a second ground pin 42 is provided. The sensor die 4 can be, for example, an optical sensor, which can be a packaged integrated circuit with a sensing area on an upper surface thereof. In addition, the first ground pin 41 and the second ground pin 42 can be provided in a form of a quad flat non-lead (QFN) or dual flat non-lead (DFN) packaged integrated circuit, and are located on a lower surface of the sensor die 4. The sensor die 4 disposed in the die-bonding region 110 and attached to the substrate 1 through the applied adhesive material 3. It should be noted that the number of ground pins is not limited in the present disclosure, and the sensor die 4 can be provided with other functional pins used to electrically connected to the electronic connections 22 to achieve certain functions.

After the sensor die 4 is attached to the substrate 1, the first ground pin 41 and the second ground pin 42 can be electrically connected to the first ground electrode 112 and the second ground electrode 114, respectively, so as to form a sensor package 60. For example, in a case that the electrically conductive adhesive material 31 is not applied on the first ground electrode 112 and the second ground electrode 114, the first ground pin 41 and the second ground pin 42 can be directly connected to the first ground electrode 112 and the second ground electrode 114, while the sensor die 4 is attached to the substrate 1 merely through the non-conductive adhesive material 30 applied in the portion of the die-bonding region 110 that does not overlap with the first window 111 and the second window 113. Since the sensor die 4 is attached to the upper protection layer 103 (e.g., the solder mask) through the non-conductive adhesive material 30, such upper board surface 11 can provide better adhesion strength than a combination of a die attached epoxy and a metalized-and-plated surface utilized in the existing electronic package.

In another case that the conductive adhesive material 31 is further applied on at least a portion of the first ground electrode 112 and at least a portion of the second ground electrode 114 by the dispensing step in step S2, the first ground pin 41 and the second ground pin 42 can be electrically connected to the first ground electrode 112 and the second ground electrode 114, respectively, in an indirectly manner through the conductive adhesive material 31. In some embodiments, the conductive adhesive material 31 can be applied to fully cover the first ground electrode 112 and the second ground electrode 114. Since the conductive adhesive material 31 can also contribute in attaching the sensor die 4 to the upper board surface 11, the adhesion strength therebetween can further be enhanced.

Figure 8:
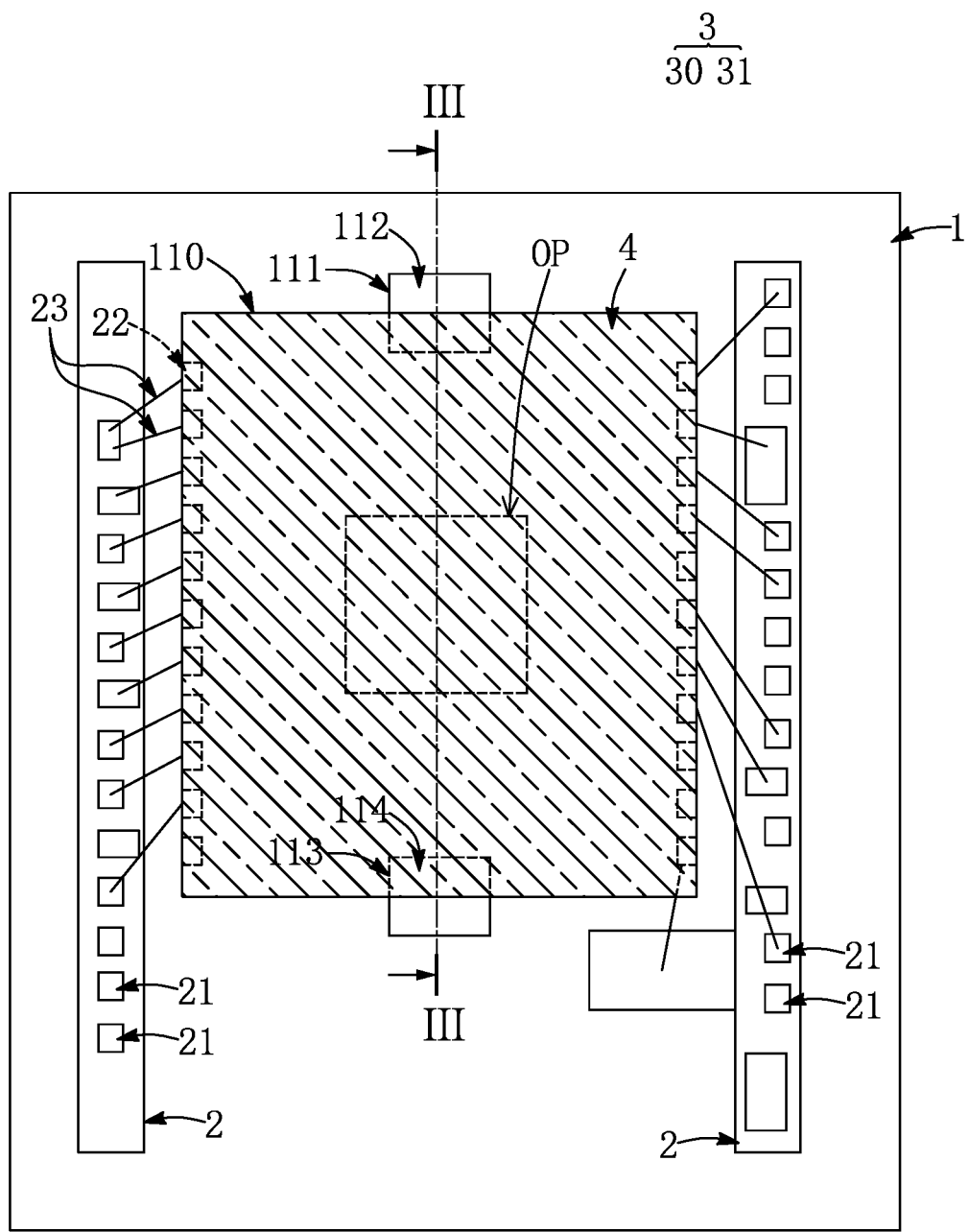
FIG. 8 is schematic top view of step S1-S3 of the sensor packaging method according to a second embodiment of the present disclosure.
Figure 9:
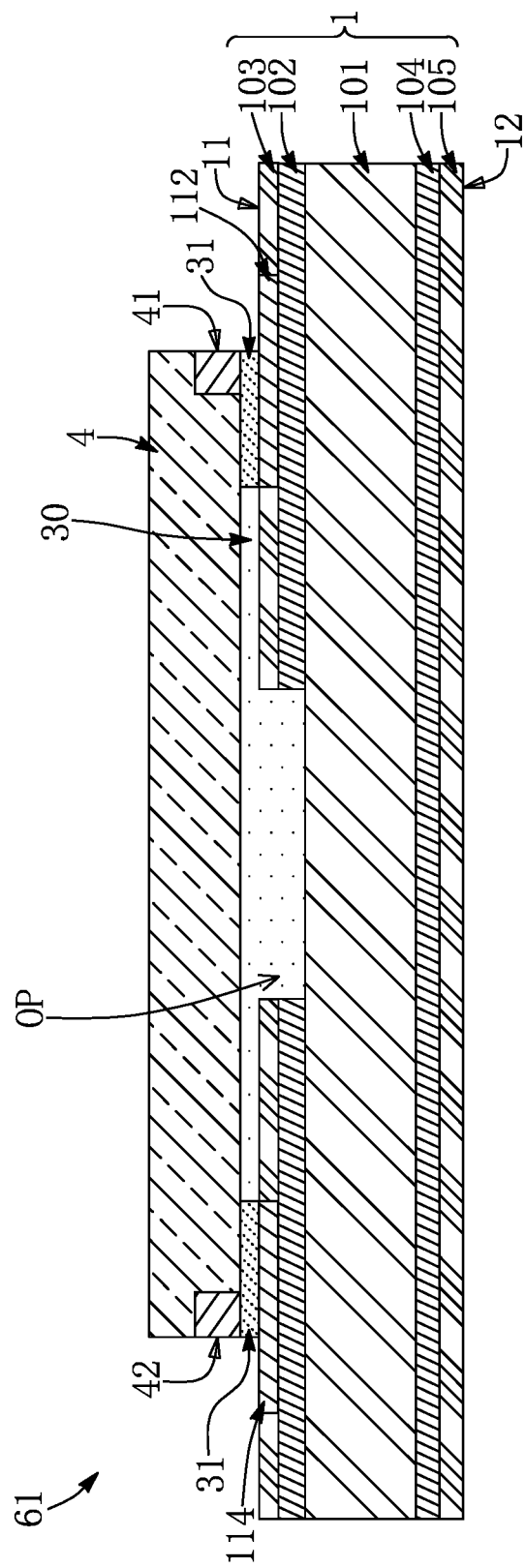
FIG. 9 is a schematic cross-sectional view taken along line IV-IV of FIG. 8.

Reference can be made to FIGS. 8 and 9, FIG. 8 is schematic top view of step S1-S3 of the sensor packaging method according to a second embodiment of the present disclosure, and FIG. 9 is a schematic cross-sectional view taken along line IV-IV of FIG. 8.

As shown in FIGS. 8 and 9, in the second embodiment, the upper board surface 11 of the substrate 1 provided in step S1 further has an opening OP that exposes the core material layer 101. The opening OP can be formed by performing, for example, a drilling process, on the upper protection layer 103 and the upper metal layer 102, so as to expose the core material layer 101.

Moreover, as shown in FIG. 8, the sensor die 4 has a projection that is projected onto the upper board surface 11, the projection is basically as the same as the die-bonding region 110, but the present disclosure is not limited thereto. An area of the projection can be larger than an area of the opening OP at the upper board surface. In some embodiments, the area of the opening OP can be larger than areas of the first window 111 and the second window 113, so as to appropriately limit the area of the opening OP occupied in the upper metal layer 102 and to reserve more area for the circuits that are necessary to the sensor die 4.

Furthermore, in step S2, the adhesive material 3 is further applied in at least a portion of the opening OP, such that the sensor die 4 can be attached to the substrate 1 through the adhesive material 3 in the opening OP, so as to form a sensor package 61. In some embodiments, the adhesive material 3 can be applied to fully cover all surfaces inside the opening OP. More specifically, the non-conductive material 30 can be dispensed in the opening OP and applied on the portion of the die-bonding region 110 that does not overlap with the first window 111 and the second window 113.

In the present embodiment, another type of surface is provided to further enhance the adhesion strength between the upper board surface 11 and the sensor die 4 for the sensor package 61. That is, a portion of the core material layer 101 that is exposed by the opening OP can also provide better adhesion strength than the combination of the die attached epoxy and the metalized-and-plated surface utilized in the existing electronic package.

Furthermore, an additional space provided by the opening OP can accommodate more adhesive material 3, so as to further ensure that sufficient adhesion strength can be provided between the sensor die 4 and the upper board surface 11 of the substrate 1.

Reference can be made to FIG. 1 again, the sensor packaging method provided by the present disclosure can proceed to step S4: disposing a sensor cover on the substrate to form an enclosed space and surround the sensor die therewithin.

Figure 10:
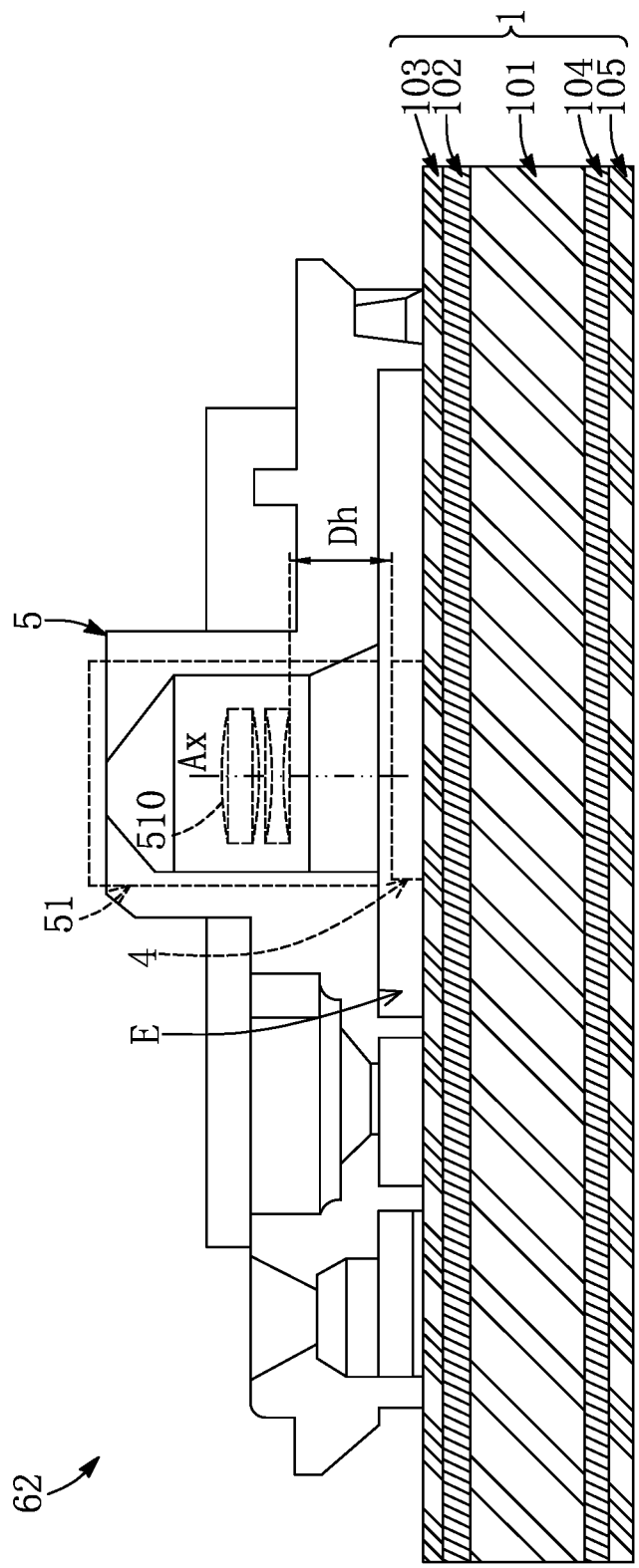
FIG. 10 is a schematic side view of step S4 of the sensor packaging method according to one embodiment of the present disclosure.

Reference is made to FIG. 10, which is a schematic side view of step S4 of the sensor packaging method according to one embodiment of the present disclosure. As shown in FIG. 10, a sensor cover 5 can be attached to the substrate 1 by using the non-conductive adhesive material 3 and the dispensing step mentioned above to form a sensor package 62. Therefore, repetitive descriptions will be omitted hereinafter. In the case that the sensor die 4 is the optical sensor, the sensor cover 5 covers the sensor die 4 and the substrate 1 to form an enclosed space E that surrounds the sensor die 4 therewithin, and the sensor cover 5 includes at least one optical element that corresponds to the sensor die 4 positionally. In certain embodiments, the sensor cover 5 can include an optical module 51 that has one or more lenses 510, and a primary optical axis Ax of the lenses 510 can be aligned to a center of a sensing area of the sensor die 4, such that the optical element(s) can positionally correspond to the sensor die 4.

Since the sensor cover 5 and the sensor die 4 are both disposed on the upper board surface 11, the upper protection layer 103 can be used as a common reference or datum for both the sensor die 4 and the sensor cover 5 as illustrated in FIG. 10. As such, a distance Dh between the at least one optical element and the sensor die 4 can be independent to a thickness of the upper protection layer 103, that is, a variation in the thickness of the upper protection layer 103 will not impact the distance Dh between the optical module and the sensor die 4, which is an important parameter for optical sensors.

Moreover, the sensor cover 5 and the optical element thereof can be designed directly according to the distance Dh without considering the thickness of upper protection layer 103. Compared to the existing electronic package, since the sensor die 4 of the present disclosure is not directly attached to a metalized-and-plated surface of the upper metal layer 102, there is no need to consider the thickness of the upper protection layer 103, which is more convenient for designers of the sensor cover 5, and is easier to fabricate the sensor package 62, especially during the process of attaching the sensor cover 5.

In conclusion, in the sensor packaging method and the sensor package provided by the present disclosure, the sensor die can be attached to the upper protection layer through the non-conductive adhesive material, such upper board surface can provide better adhesion strength than a combination of the die attached epoxy and the metalized-and-plated surface utilized in the existing electronic package.

Furthermore, in the sensor packaging method and the sensor package provided by the present disclosure, the portion of the core material layer that is exposed by the opening can also provide better adhesion strength than the existing electronic package. In addition, the conductive adhesive material applied between the ground pins and the ground electrode also contributes in attaching the sensor die to the upper board surface, so as to further enhance the adhesion strength therebetween.

Moreover, since the sensor cover and the sensor die are both disposed on the upper board surface, the upper protection layer can be used as a common reference or datum for both the sensor die and the sensor cover, such that the variation in the thickness of the upper protection layer will not impact the distance between the optical element and the sensor die.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor packaging method, comprising:
   providing a substrate having an upper board surface and a lower board surface, wherein the upper board surface has a die-bonding region, and the substrate includes:
   a core material layer;
   an upper metal layer disposed on the core material layer; and
   an upper protection layer disposed on the upper metal layer, wherein a first window is formed to penetrate the upper protection layer and located at a periphery of the die-bonding region, and the first window is opened for a first ground electrode that is electrically connected to a first ground portion of the upper metal layer;
   performing a dispensing step to apply an adhesive material on the upper board surface in at least a portion of the die-bonding region; and
   attaching a sensor die to the substrate through the adhesive material, wherein the sensor die is disposed in the die-bonding region and has a first ground pin electrically connected to the first ground electrode.

2. The sensor packaging method according to claim 1, wherein a second window is formed to penetrate the upper protection layer and located at the periphery of the die-bonding region without overlapping with the first window, and the second window is opened for a second ground electrode that is electrically connected to a second ground portion of the upper metal layer.

3. The sensor packaging method according to claim 2, wherein, in the step of attaching the sensor die to the substrate, the sensor die further has a second ground pin electrically connected to the second ground electrode.

4. The sensor packaging method according to claim 3, wherein the die-boding region is a rectangle, and the first window and the second window are respectively located at a first side and a second side of the rectangle that are opposite to each other.

5. The sensor packaging method according to claim 3, wherein the dispensing step further includes applying an electrically conductive adhesive material on at least a portion of the first ground electrode and at least a portion of the second ground electrode, and the first ground pin and the second ground pin are electrically connected to the first ground electrode and the second ground electrode, respectively, through the electrically conductive adhesive material.

6. The sensor packaging method according to claim 1, wherein the upper board surface has an opening that exposes the core material layer;
   wherein the step of the dispensing step further includes applying the adhesive material in at least a portion of the opening, such that the sensor die is attached to the substrate through the adhesive material in the opening.

7. The sensor packaging method according to claim 6, wherein the sensor die has a projection that is projected onto the upper board surface, and an area of the projection is larger than an area of the opening at the upper board surface.

8. The sensor packaging method according to claim 6, further comprising:
   disposing a sensor cover on the substrate to form an enclosed space and surround the sensor die therewithin, wherein the sensor cover includes at least one optical element that corresponds to the sensor die positionally.

9. The sensor packaging method according to claim 8, wherein a distance between the at least one optical element and the sensor die is independent to a thickness of the upper protection layer.

10. A sensor package, comprising:
    a substrate having an upper board surface and a lower board surface, wherein the upper board surface has a die-bonding region, and the substrate includes:
    a core material layer;
    an upper metal layer disposed on the core material layer; and an upper protection layer disposed on the upper metal layer, wherein a first window is formed to penetrate the upper protection layer and located at a periphery of the die-bonding region, and the first window is opened for a first ground electrode that is electrically connected to a first ground portion of the upper metal layer; and a sensor die disposed on the substrate in the die-bonding region, wherein the sensor die is attached to the substrate through an adhesive material applied in at least a portion of the die-bonding region, and the sensor die has a first ground pin electrically connected to the first ground electrode.

11. The sensor package according to claim 10, wherein a second window is formed to penetrate the upper protection layer and located at the periphery of the die-bonding region without overlapping with the first window, and the second window is opened for a second ground electrode that is electrically connected to a second ground portion of the upper metal layer.

12. The sensor package according to claim 11, wherein the sensor die further has a second ground pin electrically connected to the second ground electrode.

13. The sensor package according to claim 12, wherein the die-boding region is a rectangle, and the first window and the second window are respectively located at a first side and a second side of the rectangle that are opposite to each other.

14. The sensor package according to claim 12, wherein the first ground pin is electrically connected to the first ground electrode through a part of an electrically conductive material that is applied on at least a portion of the first ground electrode; wherein the second ground pin is electrically connected to the second ground electrode through another part of the electrically conductive material that is applied on at least a portion of the second ground electrode.

15. The sensor package according to claim 10, wherein the upper board surface has an opening that exposes the core material layer;

wherein the sensor die is attached to the substrate through the adhesive material located in at least a portion of the opening.

16. The sensor package according to claim 15, wherein the sensor die has a projection that is projected onto the upper board surface, and an area of the projection is larger than an area of the opening at the upper board surface.

17. The sensor package according to claim 15, further comprising:

a sensor cover disposed on the substrate to surround the sensor die, wherein an enclosed space is formed by the sensor cover and the substrate, and the sensor cover includes at least one optical element that corresponds to the sensor die positionally.

18. The sensor package according to claim 16, wherein a distance between the at least one optical element and the sensor die is independent to a thickness of the upper protection layer.

* * * * *